United States Patent [19]
Mosely et al.

[11] Patent Number: 5,431,799
[45] Date of Patent: Jul. 11, 1995

[54] COLLIMATION HARDWARE WITH RF BIAS RINGS TO ENHANCE SPUTTER AND/OR SUBSTRATE CAVITY ION GENERATION EFFICIENCY

[75] Inventors: Roderick C. Mosely, Mountain View; Ivo J. Raaijmakers, San Jose; Hiroji Hanawa, Santa Clara, all of Calif.

[73] Assignee: Applied Materials, Inc., Santa Clara, Calif.

[21] Appl. No.: 145,744

[22] Filed: Oct. 29, 1993

[51] Int. Cl.⁶ .............................. C23C 14/34
[52] U.S. Cl. .......................... 204/298.06; 204/298.08; 204/298.11
[58] Field of Search .................. 204/298.06, 298.11, 204/298.08

[56] References Cited

U.S. PATENT DOCUMENTS

| | | | |
|---|---|---|---|
| 3,649,502 | 3/1972 | Herte et al. | 204/192.12 |
| 4,668,338 | 5/1987 | Maydan et al. | 156/643 |
| 4,717,462 | 1/1988 | Homma et al. | 204/298.06 |
| 4,824,544 | 4/1989 | Mikalesen et al. | 204/298.06 |
| 4,931,158 | 6/1990 | Bunshah et al. | 204/192.29 |
| 4,962,063 | 10/1990 | Maydan et al. | 437/238 |
| 5,021,121 | 6/1991 | Groechel et al. | 156/643 |
| 5,108,569 | 4/1992 | Gilboa et al. | 204/192.13 |
| 5,178,739 | 1/1993 | Barnes et al. | 204/192.12 |
| 5,202,008 | 4/1993 | Talieh et al. | 204/192.32 |

FOREIGN PATENT DOCUMENTS

| | | | |
|---|---|---|---|
| 0313750 | 5/1989 | European Pat. Off. | C23C 14/34 |
| 0451642 | 10/1991 | European Pat. Off. | 204/298.2 |
| 0520519 | 12/1992 | European Pat. Off. | 156/345 |
| 61-190070 | 8/1986 | Japan | 204/298.06 |

OTHER PUBLICATIONS

Rossnagel et al. "Magnetron Sputter Deposition With High Levels Of Metal Ionization", Appl. Phys. Lett., vol. 63, No. 24, pp. 3285-3287, 13 Dec. 1993.

Primary Examiner—Aaron Weisstuch
Attorney, Agent, or Firm—Eric L. Prahl

[57] ABSTRACT

A plasma deposition system for sputter depositing material from a target onto a wafer, the system including a vacuum chamber; a platform for holding the wafer during plasma processing; a source onto which the target is mounted and for generating a plasma in the chamber during operation; an equipotential conductive plane dividing the chamber into an upper cavity in which the target is located and a lower cavity in which the wafer is located, the equipotential conductive plane permitting material sputtered from the target to pass therethrough; and an upper antenna located inside the upper cavity and surrounding the plasma, the upper antenna for coupling RF power into the source-generated plasma.

23 Claims, 2 Drawing Sheets

COLLIMATION HARDWARE WITH RF BIAS RINGS TO ENHANCE SPUTTER AND/OR SUBSTRATE CAVITY ION GENERATION EFFICIENCY

BACKGROUND OF THE INVENTION

The invention relates to physical vapor deposition equipment such as are used in the fabrication of integrated circuits and semiconductor devices.

Physical vapor deposition (PVD) is a process by which a target material (e.g. Ti) is deposited onto an object (e.g. a semiconductor wafer) by means of a plasma. The process takes place in a vacuum chamber that contains an inert gas (e.g. argon). The plasma, which is generated in the chamber between the negatively biased target and the wafer, ionizes the inert gas. The positively charged ionized gas atoms are pulled toward the negatively biased target and impact it with sufficient energy to expel (i.e., sputter) atoms of target material from the target. The sputtered atoms from the target are propelled toward the wafer where they form a layer of deposited material.

The trajectories of the material coming off from the target during sputtering are distributed over a range of directions. Though typically most of the sputtered material travels in a direction that is normal to the target, a significant amount travels in other directions that diverge from the normal direction. The sputtered material which travels along the divergent directions tends to limit the definition that is obtainable at discontinuities on the wafer surface. More specifically, the material which travels along the non-normal trajectories deposits on the sidewalls of features such as thru-holes and vias, thereby limiting how small one can make those features. For holes that are too small, the material deposited on the sidewalls eventually closes up the hole and prevents any further material from being deposited at the bottom of the hole.

Collimation filters are used to filter out all sputtered material having a trajectory that diverges from the normal direction by more than a preselected angle. The collimation filter is placed between the target and the wafer. In general, it is a metal plate having a particular thickness with an array of holes passing through it. To maximize throughput, a honeycomb structure (i.e., a pattern of hexagonal holes) is used. The holes have a specified aspect ratio, i.e., the ratio of their length to their diameter. The aspect ratio determines the degree of filtering which takes place. A higher aspect ratio produces a narrower angular filter (i.e., the preselected angle is smaller). A consequence of using a higher aspect ratio, however, is a significantly reduced throughput. Thus, picking the appropriate thickness and hole size for the collimation filter is simply a question of process optimization.

Nevertheless, for a typical filter design in a conventional system, only about 20% of the material will make it through the filter. The rest of the material, which represents sputtered material that has a trajectory that diverges from the normal direction by more than the preselected angle, deposits on the filter. In this example, the collimation filter reduces throughput by a factor of 5.

To compensate for the reduced throughput, users typically increase the operational power on the target. For example, rather than running at a 5 kW power level, the power is increased to about 20 kW. The increased power levels increase the rate of sputtering. They also, however, introduce other problems, e.g. increased temperature of the wafer and unwanted material interactions in the deposited layer.

SUMMARY OF THE INVENTION

It was discovered that much of the ionization in a plasma sputtering chamber occurs very close to the target, leaving a considerable amount of room for ionization enhancement throughout the rest of the plasma. It was also discovered that RF power can be effectively coupled into the DC generated plasma through a coil or ring antenna inside the chamber. The coupled RF power contributes to increasing ionization efficiency rather than causing a sputtering of the ring material.

In general, in one aspect, the invention is a plasma deposition system for sputter depositing material from a target onto a wafer. The system includes a chamber; a platform for holding the wafer during plasma processing; a source onto which the target is mounted; an equipotential conductive plane dividing the chamber into an upper cavity in which the target is located and a lower cavity in which the wafer is located; and an upper antenna located inside the upper cavity and surrounding the plasma. The source generates a plasma in the chamber during operation. The equipotential conductive plane permits material sputtered from the target to pass into the lower cavity. And the upper antenna couples RF power into the source-generated plasma.

In preferred embodiments, the plasma deposition system also includes a lower antenna located inside the lower cavity for generating a second plasma in the lower cavity. Also, the equipotential plane is a collimation filter that is made of a refractory material (e.g. titanium).

In general, in another aspect, the invention is a plasma deposition system for sputter depositing material from a target onto a wafer. The system includes a chamber; a platform for holding the wafer during plasma processing; a source onto which the target is mounted; and an antenna located inside of the chamber and surrounding the plasma. The source generates a plasma in the chamber during operation and the antenna is for coupling RF power from an RF supply into the source-generated plasma.

With conventional plasma deposition techniques, the user actually has quite limited control over the conditions under which the films are produced and thus the properties of the generated films. For example, it is generally not practical to lower the source power level (and thus the temperature) beyond a certain point because this also significantly reduces throughput. Though more desirable film properties may be achievable by operating at low DC power levels, high throughput is essential for production purposes. Thus, compromises must be made on what film properties are produced. The upper antenna permits the user to have much greater control over the plasma deposition process at throughputs that are acceptable for production purposes and to thereby access a wider range of film properties.

The lower cavity antenna enables the user to exercise greater optimization control over the plasma deposition process. For example, the nitrogen sticking coefficient strongly depends upon temperature as does the ability to react Ti with $N_2$ to form TiN. However, these two reactions move in opposite directions with temperature.

While the sticking coefficient improves with decreasing temperatures, the reactivity of the reactive gas species decreases. In a conventional system, there is generally an optimum process temperature at which one achieves the best reactivity while still maintaining acceptable sticking coefficient. Thus, when using conventional plasma deposition techniques, one must run at the appropriate power level which achieves the optimum temperature. With the invention, however, a user can increase the reactivity of the $N_2$ at lower temperatures where there is a better sticking coefficient without having to increase the power level of the source-generated plasma. Thus, the invention enables the user to run at a lower temperature (and lower power levels) without sacrificing reactivity and thereby produce more stoichiometric films and films with different, possibly more desirable, properties.

The lower cavity antenna also enables the user to more easily control the energy of the arriving species that is sputtered from the target. This, in turn, enables the user to have greater control over process optimization. For example, in aluminum planarization work using conventional deposition techniques, people have typically used DC or RF bias on the wafer to further stimulate the deposited atoms to move into the contacts. But this approach brought with it other problems. The arriving atoms, having much higher energy, altered the properties of the resulting film and tended to produce defects in the film. By using the ring antenna in the lower cavity to vary the impedance above the wafer, the user can change the film properties in an advantageous way without having to use high levels on the wafer to do so. Rather than coupling RF or DC power to the wafer, the lower antenna couples it to the plasma and then lets the plasma potential enhance the bombardment energy. Thus, the user can employ very low bias on the wafer (e.g. 10 V) so that the energy of the arriving atoms is much lower and less likely to disrupt the film that is forming. This enables the user to have greater control over the density of the film and the surface states which affect the resulting barrier characteristics.

Other advantages and features will become apparent from the following description of the preferred embodiment and from the claims.

DESCRIPTION OF THE PREFERRED EMBODIMENTS

Figure 1:
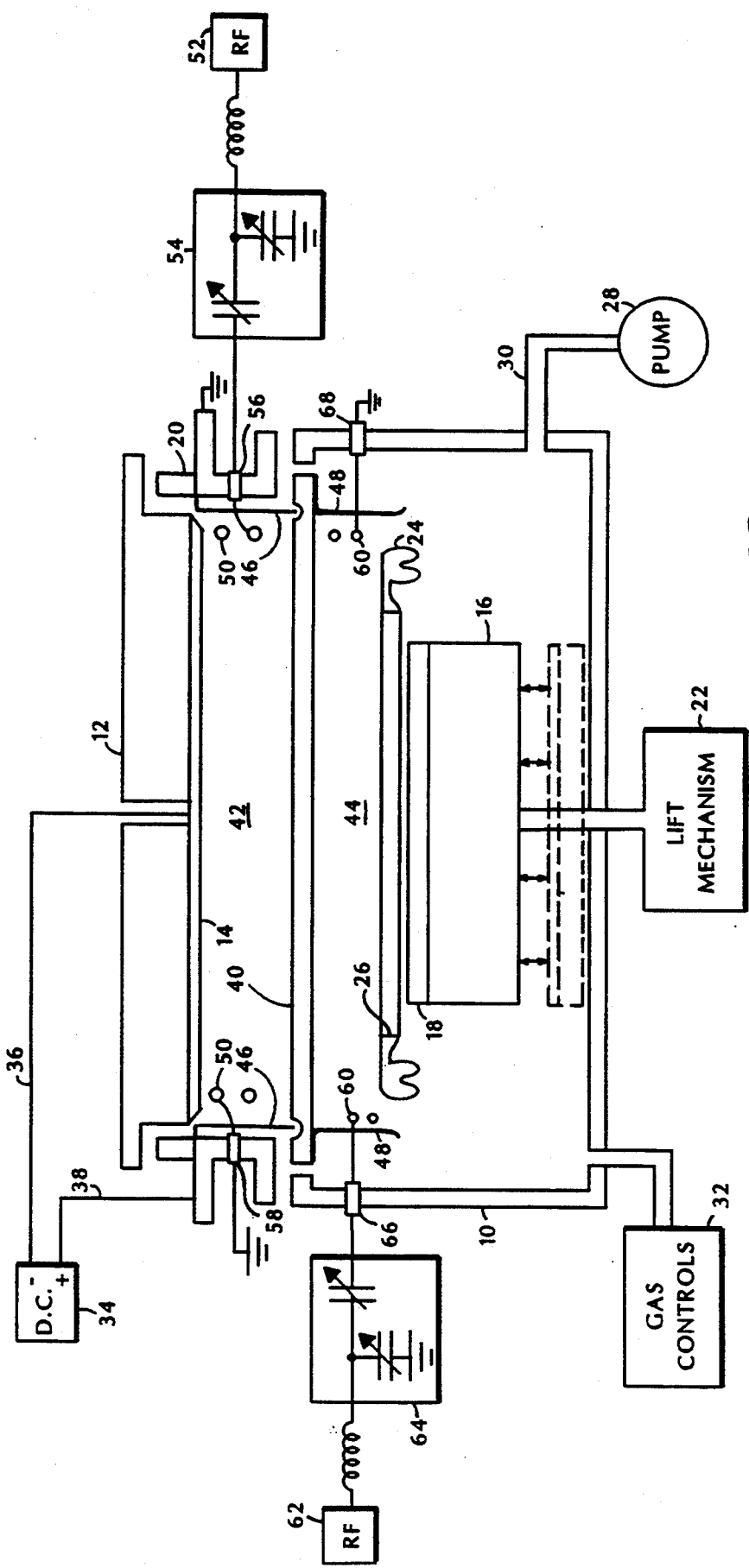
FIG. 1 shows a sputter deposition chamber including a collimation filter as well as upper and lower cavity RF bias ring antennas that both inductively couple to the plasma within the chamber.

Referring to FIG. 1, a sputter deposition system includes a deposition chamber 10, a source assembly 12 on which a sputter target 14 is mounted, and a movable lower platform 16 holding a wafer 18 on which material sputtered from target 14 is deposited. The source assembly and the target mounted thereon are electrically isolated from the rest of the chamber by an insulator ring 20. The lower platform can be raised and lowered by a mechanical lift mechanism 22. After the wafer is placed on the platform, the lift mechanism raises the wafer until it contacts a clamping ring 24. The clamping ring has a central aperture 26 that is slightly smaller than the diameter of the wafer and it shields the platform from deposition material during processing.

A vacuum pump 28, which is connected to the chamber through a vacuum line 30, is used to evacuate the chamber at the beginning of a process run. Flow of inert gas (e.g. Ar) and reactive gases (e.g. $N_2$) in and out of the chamber is controlled by gas control circuitry 32. Power for initiating and sustaining a plasma deposition process is supplied to the target by a DC voltage supply 34. The negative terminal of the DC supply is connected to the target through a line 36 and the positive terminal of the DC supply is connected to the wall of the chamber through another line 38.

In the described embodiment, the source is a magnetron which includes a set of magnets (not shown) positioned behind the target material. The magnets increase the sputtering efficiency by preventing the electrons from rapidly escaping away from the face of the target and keeping them within a short distance of the target for a longer period of time so that they can thereby cause multiple ionizations of the inert gas (e.g. Ar). In such a source, the magnets rotate around the back of the target in order to improve the uniformity of the erosion of the target during sputtering.

A collimation filter 40 separates chamber 10 into an upper cavity 42 and a lower cavity 44. The collimation filter is connected to ground and thus forms a ground plane separating the two cavities. Within the upper cavity and around its inside perimeter there is a cylindrical shield 46 that prevents material from being deposited on the walls of the chamber. Likewise, the lower cavity also includes another cylindrical shield 48 which serves a similar purpose. Both shields are connected to ground potential.

Inside the upper cavity, an upper ring antenna 50 couples RF power to the plasma generated by source 12. An RF generator 52 coupled to the upper ring antenna through an RF matching network 54 provides the RF power to the upper ring antenna. The electrical connection is made through a feed-through 56 in the wall of the chamber to one side of the upper ring antenna. The other side of the upper ring antenna is electrically connected to ground through another feed-through 58 in the chamber.

Inside the lower cavity, a second ring antenna 60 couples RF power to the sputtered species passing through the collimation filter to the wafer. A second RF generator 62 coupled to lower ring antenna 60 through a second RF matching network 64 provides the RF power to the lower ring antenna. As with the upper ring antenna, the electrical connection is made through a feed-through 66 in the wall of the chamber to one side of the lower ring antenna. The other side of the lower ring antenna is electrically connected to ground through another feed-through 68 in the chamber.

Typically, the RF power supplied to the upper and lower ring antennas will be less than about 5 kW, though in some applications it may be desirable to use higher power levels (e.g. 20 kW). The precise power levels will depend upon the results that are desired and thus will vary from one application to the next.

Each RF matching network creates a resonant circuit with its associated ring antenna so as to achieve high current in the antenna (i.e., efficient coupling of energy into the antenna). They include variable components that enable the user to tune them for optimum coupling to the plasma during a processing run. Since such tunable matching networks are well known to persons of ordinary skill in the art, they will not be described in greater detail here.

In the described embodiment, which processes 8 inch wafers, the target size is about 13 inches. The target material may be any of a wide variety of materials including, for example, Ti, TiN, or W-materials which are typically used for producing ohmic contacts or device barriers. The spacing between the target and the wafer when the wafer is in a fully raised position is typically about 94 mm. The collimation filter is positioned approximately midway between the target and the wafer. It has a honeycomb structure, it is made of a refractory material such as titanium, it has a thickness of about 0.950 inch and the holes are about 0,625 inch in diameter. The upper and lower antennas are positioned at approximately the midpoints of in their respective cavities and are located around the inside periphery of the chamber.

The upper and lower antennas provide a means by which the user can pump energy into the plasma and thereby dramatically affect the total production of ions. The upper and lower ring antennas are made of a conductive material (e.g. aluminum or copper) that is also resistant to the conditions existing in the plasma sputtering chamber. They may be single or multiple turn coils (e.g. 2–3 turns), the number of turns, of course, depending upon the frequency of the RF generators. In the described embodiment, RF frequencies within the range of 400 kHz to 40 MHz may be used.

In the upper cavity, the plasma is generated by the DC voltage supply and the upper antenna provides a way to couple further energy into that plasma. By pumping further energy into the plasma, the user can increase the number of inert gas ions that are available for sputtering the target at the power level determined by the DC voltage supply. That is, the upper antenna serves to lower the source impedance of the target. Thus, with the aid of the upper antenna, the user can increase throughput at a given power level and thereby compensate for the reduced throughput resulting from the collimation filter. Also, since sputter distribution is dependent upon the source impedance, the upper antenna enables the user to control the shape of the sputter distribution. In addition, the upper antenna tends to ionize the material that is sputtered from the target, which tends to straighten the trajectories of the sputtered material and to further concentrate more of the plasma along the direction normal to the target. Thus, it becomes possible to reduce the amount of material that is deposited on the filter and further increase throughput.

It should be noted that the improved sputtering efficiency achieved by the upper antenna may make it more practical to use sources other than a magnetron. The loss in efficiency attributable to some less efficient sources will be more than compensated by the beneficial effects of the upper antenna. Eliminating the magnetron has the added benefit of improving the erosion uniformity of the target.

Since the lower cavity is separated from the upper cavity by a ground plane (i.e., the collimation filter), the plasma from the upper cavity will typically not penetrate into the lower cavity. Thus, the lower antenna and the RF generator driving it are used to strike and maintain a separate plasma in the lower cavity. Through the second plasma generated in the lower cavity, the user can enhance the ionization of the reactive species (e.g. $N_2$), which in turn will alter its reaction rate with the sputtered species. This capability may be particularly useful in, for example, coherent TiN deposition processes, in which it may be important to control the reactivity of the reactive gas species and to thereby produce films with different properties.

Note that turning on the RF power to the lower antenna does not affect the sputter rate of the target but it does increase the bombardment energy and ionization of the sputtered species onto the wafer. Thus, the lower antenna can be used to optimize the bombardment energy to control the characteristics of the deposited material and the barrier characteristics.

Figure 2:
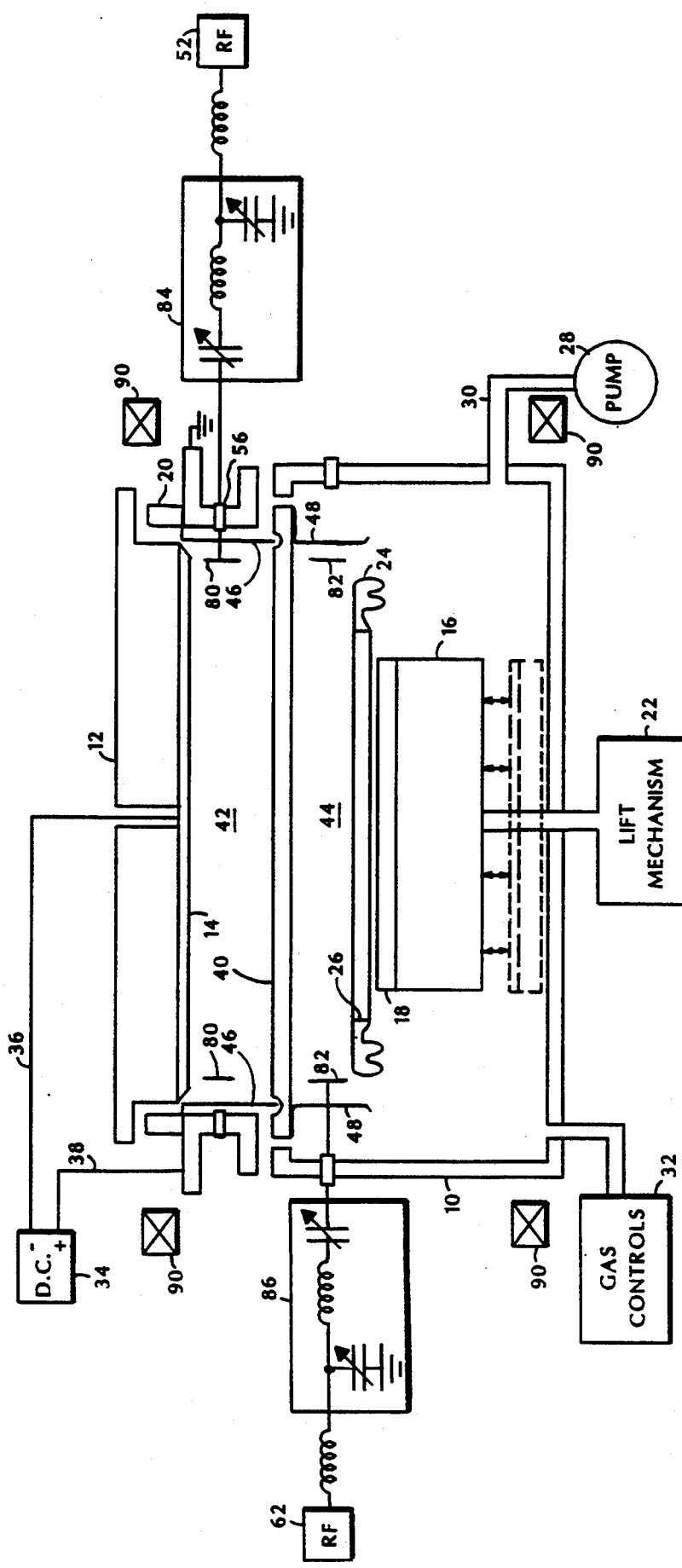
FIG. 2 shows an alternative embodiment using upper and lower chamber RF bias ring antennas that capacitively couple to the plasma within the chamber.

Referring to FIG. 2, in a capacitively coupled system, the upper and lower ring antennas are formed by continuous cylindrical plates or rings 80 and 82, respectively, rather than by coils. Through the cylindrical plates, RF power is capacitively coupled into the plasma. In all other respects, however, the internal design of the chamber is similar to what was previously described. Of course, different RF matching circuits 84 and 86 are provided which are designed for efficiently coupling power into a capacitive load rather than an inductive load. Also, in the capacitively coupled system, it may be desirable to produce a magnetic field in the chamber pointing from the target to the wafer. Such a magnetic field would assist in confining the plasma and enhancing its density. It can be generated by a set of Helmholtz coils 90 that are located outside of and surround the chamber, as shown diagrammatically in the figure.

Other embodiments are within the following claims. For example, the upper antenna can also be used in a deposition system by itself with no collimation filter or lower antenna. In that application, it would serve to control the target impedance and ionization efficiency as previously described. Also, though the described embodiment used a DC voltage supply as the power source, it could instead use an RF source or a hybrid DC voltage supply and RF power source. In addition, a DC bias could be applied to the wafer.

What is claimed is:

1. A plasma deposition system for sputter depositing material from a sputtering target onto a substrate, said system comprising:
    a vacuum chamber;
    a platform for holding the substrate during plasma processing;
    a source assembly onto which the sputtering target is mounted, said source assembly generating a plasma in said chamber when powered by a power source;
    an equipotential conductive plane dividing said chamber into an upper cavity in which the target is located and a lower cavity in which the substrate is located, said equipotential conductive plane permitting material sputtered from said target to pass therethrough; and
    an upper antenna located entirely above the equipotential conductive plane, inside the upper cavity, and surrounding the plasma, said upper antenna for coupling RF power into the source-generated plasma.

2. The plasma deposition system of claim 1 wherein said substrate is wafer-shaped.

3. The plasma deposition system of claim 2 further comprising a lower antenna located inside the lower cavity and for generating a second plasma in the lower cavity.

4. The plasma deposition system of claim 3 wherein said lower antenna is a coil through which RF power is inductively coupled into said second plasma.

5. The plasma deposition system of claim 4 wherein said lower cavity antenna coil has multiple turns.

6. The plasma deposition system of claim 3 wherein said lower antenna is a cylindrical plate through which RF power is capacitively coupled into said second plasma.

7. The plasma deposition system of claim 2 wherein said equipotential plane is a collimation filter.

8. The plasma deposition system of claim 7 wherein said collimation filter is made of a refractory material.

9. The plasma deposition system of claim 8 wherein said collimation filter is made of titanium.

10. The plasma deposition system of claim 7 further comprising a first matching circuit connected to said upper antenna and a first RF generator providing RF power to said upper antenna through said first matching circuit.

11. The plasma deposition system of claim 10 further comprising a second matching circuit connected to said lower antenna and a second RF generator providing RF power to said lower antenna through said second matching circuit.

12. The plasma deposition system of claim 2 wherein said upper antenna is a coil through which RF power is inductively coupled into said source-generated plasma.

13. The plasma deposition system of claim 12 wherein said upper cavity antenna coil has multiple turns.

14. The plasma deposition system of claim 2 wherein said upper antenna is a cylindrical plate through which RF power is capacitively coupled into said source-generated plasma.

15. A plasma deposition system of claim 2 further comprising a DC power supply connected to said source assembly, said DC power supply generating said source-generated plasma.

16. A plasma deposition system for sputter depositing material from a sputtering target onto a semiconductor substrate, said system comprising:
   a vacuum chamber;
   a platform for holding the substrate during plasma processing;
   a source assembly onto which the sputtering target is mounted, said source assembly generating a plasma in said chamber when powered by a power source;
   an equipotential conductive plane dividing said chamber into an upper cavity in which the target is located and a lower cavity in which the substrate is located, said equipotential conductive plane permitting material sputtered from said target to pass therethrough;
   an upper antenna located inside the upper cavity and surrounding the plasma, said upper antenna for coupling RF power into the source-generated plasma;
   a first matching circuit connected to said upper antenna;
   a first RF generator providing RF power to said upper antenna through said first matching circuit;
   a lower antenna located inside the lower cavity and for generating a second plasma in the lower cavity;
   a second matching circuit connected to said lower antenna; and
   a second RF generator providing RF power to said lower antenna through said second matching circuit.

17. A plasma deposition system for sputter depositing material from a sputtering target onto a substrate, said system comprising:
   a vacuum chamber;
   a platform for holding the substrate during plasma processing;
   a source assembly onto which the sputtering target is mounted, said source assembly generating a plasma in said chamber when powered by a power source;
   an equipotential conductive plane dividing said chamber into an upper cavity in which the target is located and a lower cavity in which the substrate is located, said equipotential conductive plane permitting material sputtered from said target to pass therethrough; and
   an antenna located entirely below the equipotential conductive plane and inside the lower cavity for coupling power into a plasma in said lower cavity above said substrate.

18. The plasma deposition system of claim 17 wherein said substrate is wafer-shaped.

19. The plasma deposition system of claim 18 further comprising a matching circuit connected to said lower cavity antenna and an RF generator providing RF power to said lower cavity antenna through said matching circuit.

20. The plasma deposition system of claim 19 wherein said lower cavity antenna is a coil through which RF power is inductively coupled into the plasma in said lower cavity.

21. The plasma deposition system of claim 20 wherein said lower cavity antenna coil has multiple turns.

22. The plasma deposition system of claim 19 further comprising a DC power supply connected to said source assembly, said DC power supply generating said source-generated plasma.

23. A plasma deposition system for sputter depositing material from a sputtering target onto a substrate, said system comprising:
   a vacuum chamber;
   a platform for holding the substrate during plasma processing;
   a source assembly onto which the sputtering target is mounted, said source assembly generating a plasma in said chamber when powered by a power source;
   an equipotential conductive plane dividing said chamber into an upper cavity in which the target is located and a lower cavity in which the substrate is located, said equipotential conductive plane permitting material sputtered from said target to pass therethrough;
   an upper antenna located inside the upper cavity and surrounding the plams, said upper antenna for coupling RF power into the source-generated plasma; and
   a lower antenna located inside the lower cavity for generating a second plasma in the lower cavity.

* * * * *